(12) United States Patent
Slesazeck et al.

(10) Patent No.: US 10,043,567 B2
(45) Date of Patent: Aug. 7, 2018

(54) MULTILEVEL FERROELECTRIC MEMORY CELL FOR AN INTEGRATED CIRCUIT

(71) Applicant: NaMLab gGmbH, Dresden (DE)

(72) Inventors: Stefan Slesazeck, Arnsdorf (DE); Halid Mulaosmanovic, Dresden (DE)

(73) Assignee: NaMLab gGmbH, Dresden (DE)

( * ) Notice: Subject to any disclaimer, the term of this patent is extended or adjusted under 35 U.S.C. 154(b) by 0 days.

(21) Appl. No.: 15/823,230

(22) Filed: Nov. 27, 2017

(65) Prior Publication Data

US 2018/0082729 A1    Mar. 22, 2018

Related U.S. Application Data

(63) Continuation of application No. 15/367,629, filed on Dec. 2, 2016, now Pat. No. 9,830,969.

(30) Foreign Application Priority Data

Dec. 3, 2015  (DE) .................. 10 2015 015 854

(51) Int. Cl.
| | | |
|---|---|---|
| *G11C 11/00* | (2006.01) | |
| *G11C 11/22* | (2006.01) | |
| *H01L 29/78* | (2006.01) | |
| *H01L 29/51* | (2006.01) | |
| *H01L 27/11507* | (2017.01) | |
| *H01L 49/02* | (2006.01) | |
| *H01L 27/1159* | (2017.01) | |

(52) U.S. Cl.
CPC ........ *G11C 11/2275* (2013.01); *G11C 11/221* (2013.01); *G11C 11/223* (2013.01); *G11C 11/2273* (2013.01); *H01L 27/1159* (2013.01); *H01L 27/11507* (2013.01); *H01L 28/60* (2013.01); *H01L 29/516* (2013.01); *H01L 29/517* (2013.01); *H01L 29/78391* (2014.09)

(58) Field of Classification Search
USPC .......................................... 365/145, 148, 163
See application file for complete search history.

(56) References Cited

U.S. PATENT DOCUMENTS

| | | |
|---|---|---|
| 6,091,621 A | 7/2000 | Wang et al. |
| 6,441,417 B1 | 8/2002 | Zhang et al. |

(Continued)

FOREIGN PATENT DOCUMENTS

| | | |
|---|---|---|
| DE | 19830569 C1 | 11/1999 |
| DE | 69520265 T2 | 9/2001 |

(Continued)

*Primary Examiner* — Vu Le
(74) *Attorney, Agent, or Firm* — Edell, Shapiro & Finnan, LLC

(57) ABSTRACT

An integrated circuit includes a ferroelectric memory cell. The ferroelectric memory cell includes a ferroelectric layer stack comprising at least one ferroelectric material oxide layer. Each of the ferroelectric material oxide layers includes a ferroelectric material that is at least partially in a ferroelectric state. The ferroelectric layer stack comprises at least two ferroelectric domains. Further, the voltage which is to applied to the layer stack to induce polarization reversal differs for the individual domains such that polarization reversal of individual domains or of a portion of the totality of ferroelectric domains within the ferroelectric material of can be attained.

17 Claims, 13 Drawing Sheets

(56) References Cited

U.S. PATENT DOCUMENTS

| | | |
|---|---|---|
| 6,760,246 B1 | 7/2004 | Kamp et al. |
| 2006/0056225 A1* | 3/2006 | Hashimoto ............. G11C 11/22 365/145 |
| 2006/0081901 A1 | 4/2006 | Arimoto et al. |
| 2014/0355328 A1 | 12/2014 | Muller et al. |
| 2015/0214322 A1 | 7/2015 | Mueller et al. |

FOREIGN PATENT DOCUMENTS

| | | |
|---|---|---|
| DE | 102008024519 A1 | 12/2009 |
| WO | 2006091108 A1 | 8/2006 |

\* cited by examiner

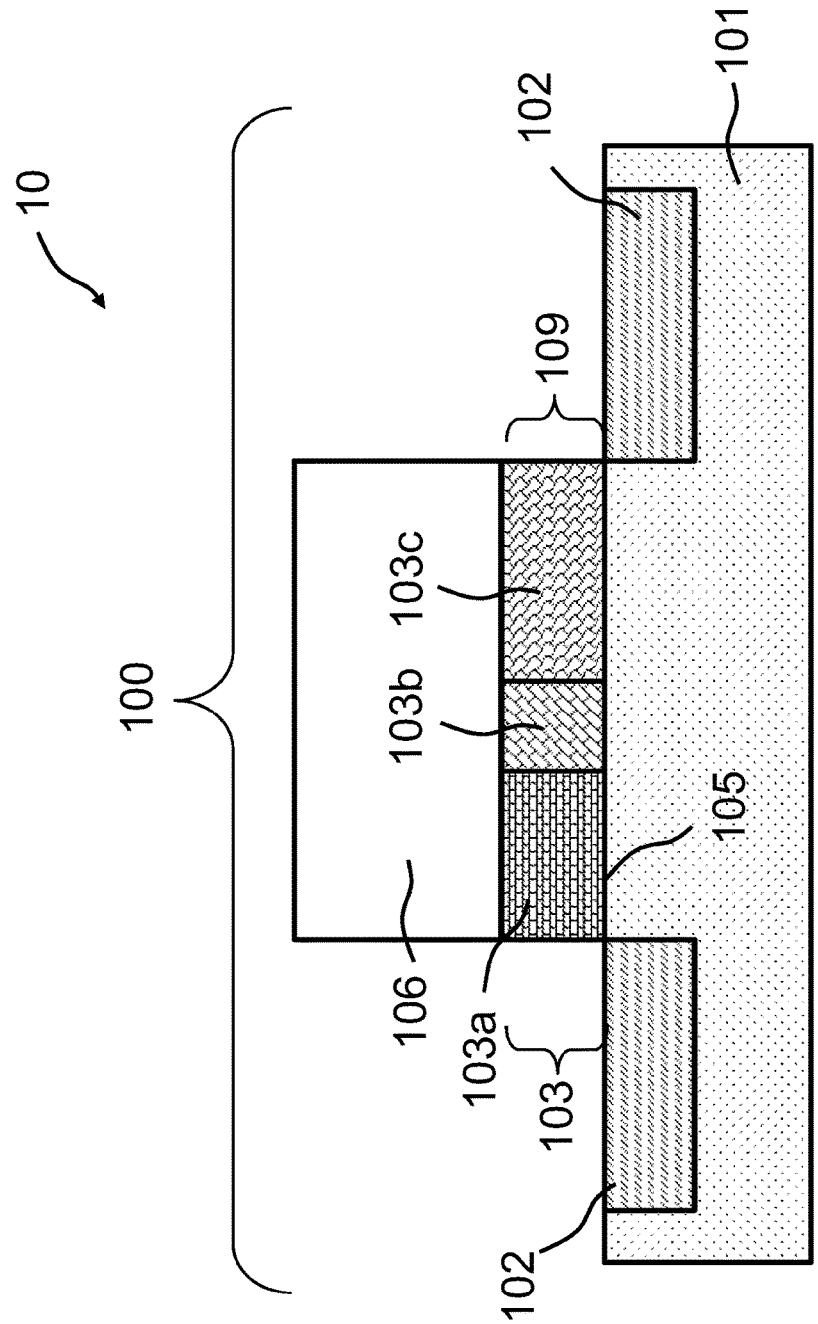

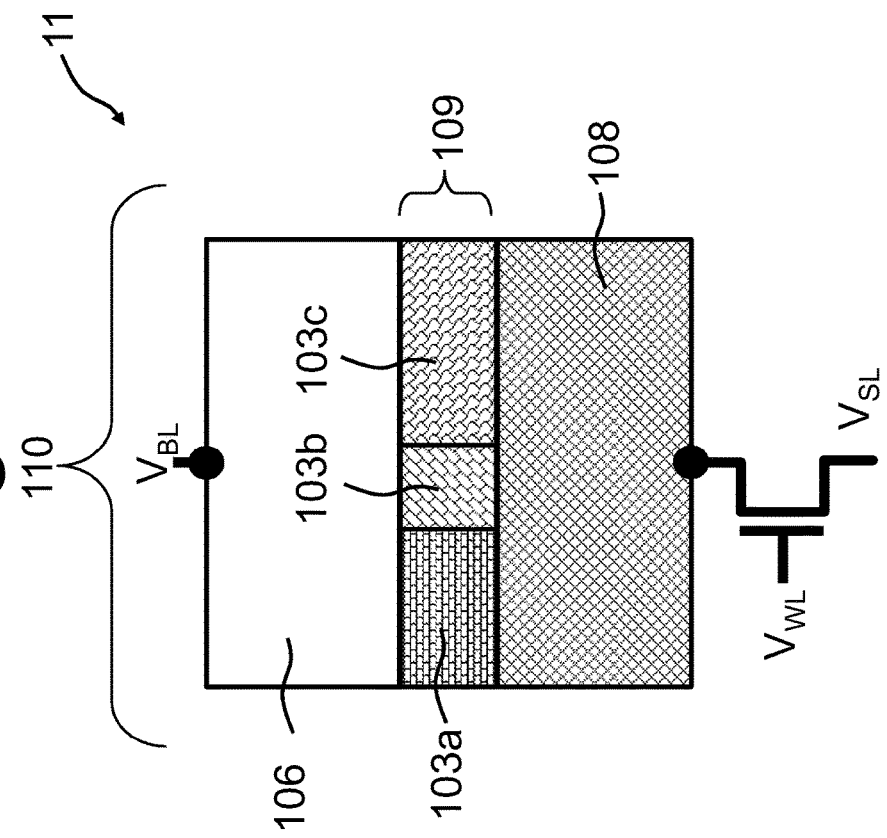

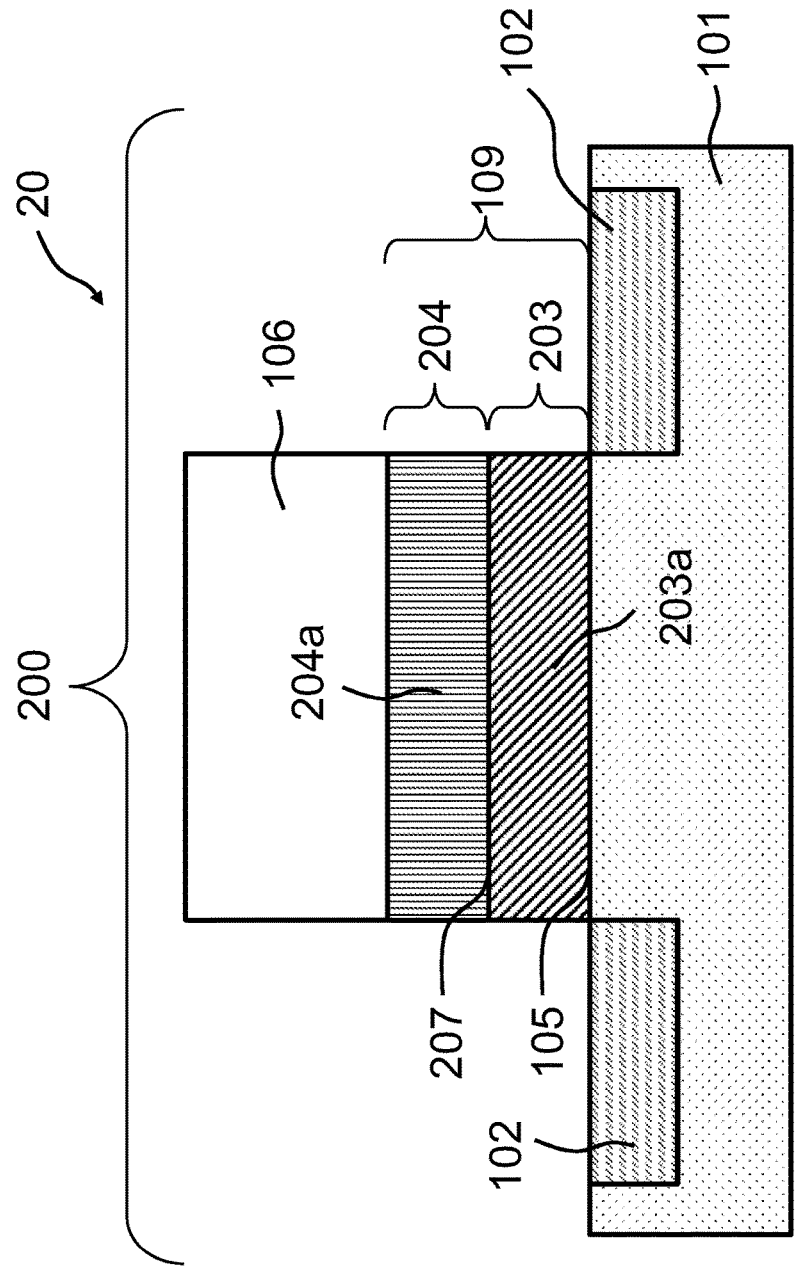

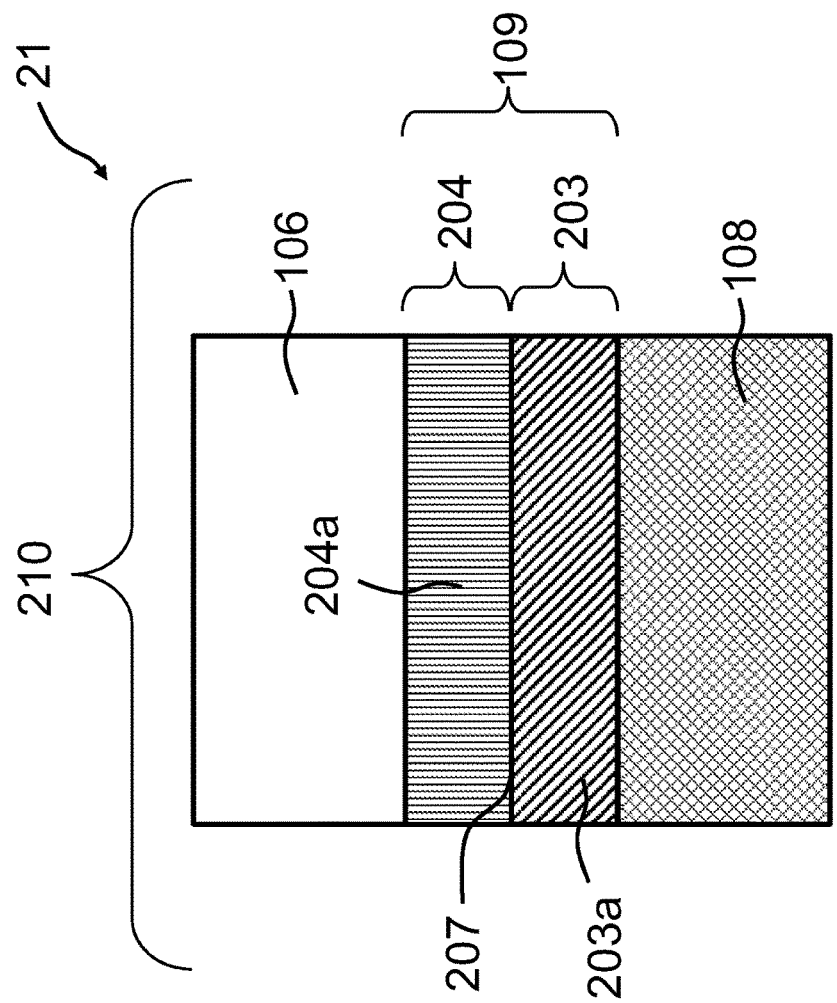

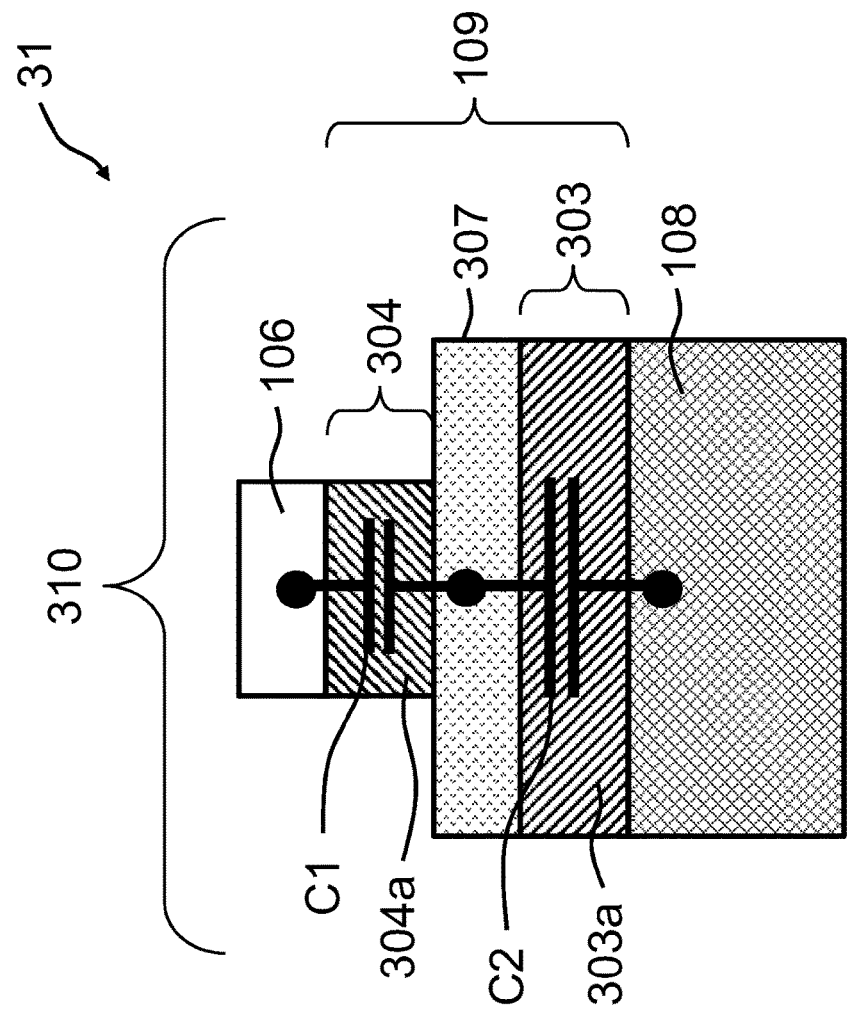

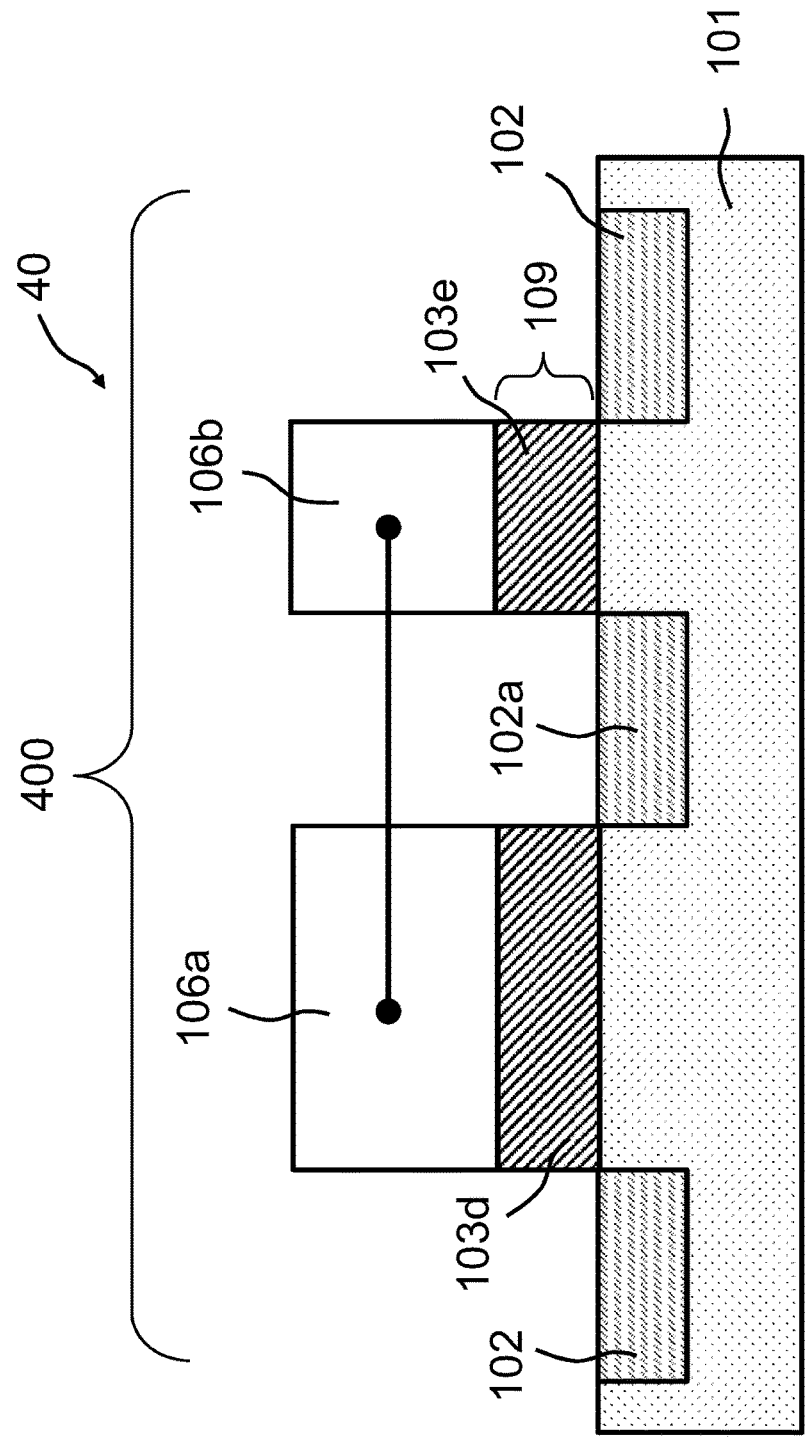

Fig. 6a

| | $V_G$ | $V_D$ | $V_S$ | $V_B$ |
|---|---|---|---|---|
| Idle state | 0V | 0V | 0V | 0V |
| Read | $V_{G,r}$ | $V_{D,r}$ | 0V | 0V |
| Write '11' | $V_{PP}$ | 0V | 0V | 0V |
| Write '00' | $-V_{EE}$ | 0V | 0V | 0V |
| Write '10' | $V_{PP}, -V_E$ | 0V | 0V | 0V |
| Write '01' | $-V_{EE}, V_P$ | 0V | 0V | 0V |
| | $-V_{EE} < -V_E < V_P < V_{PP}$ | | | |

MULTILEVEL FERROELECTRIC MEMORY CELL FOR AN INTEGRATED CIRCUIT

CROSS REFERENCE TO RELATED APPLICATIONS

This application is a continuation of U.S. patent application Ser. No. 15/367,629 filed Dec. 2, 2016, which claims foreign priority under 35 U.S.C. § 119(a)-(d) to Application No. DE 102015015854.6 filed on Dec. 3, 2015, the entire contents of which are hereby incorporated by reference.

BACKGROUND

Many electronic devices and systems have the capability to store and retrieve information in a memory structure. A number of different memory structures are used in such systems. One prominent volatile memory is a DRAM structure that allows for high speed and high capacity data storage. Some examples of non-volatile memory structures include ROM, Flash structures, ferroelectric structures (e.g., FeRAM and FeFET devices) and MRAM structures.

With regard to ferroelectric (FE) structures, these structures can be in the form of a capacitor (e.g., a FeRAM) or a transistor (FeFET), where information can be stored as a certain polarization state of the ferroelectric material within the structure. The ferroelectric material that can be used is hafnium dioxide or zirconium dioxide or a solid solution of both transition metal oxides. In the case of pure hafnium oxide, the remnant polarization can be improved by a certain amount of dopant species which has to be incorporated into the $HfO_2$ layer during the deposition.

The ferroelectric material is intended to partially or fully replace the gate oxide of a transistor or the dielectric of a capacitor. The switching is caused by applying an electrical field via voltage between transistor gate and transistor channel. Specially, for n-channel transistors, ferroelectric switching after application of a sufficiently high positive voltage pulse causes a shift of the threshold voltage to lower or negative threshold voltage values. For p-channel transistors a negative voltage pulse causes a shift of the threshold voltage to more positive threshold voltage values.

FeFET memory enjoys a number of advantages over other Flash storage devices. It generally offers faster read and write access times and lower power consumption during write operation due to the different physical storage mechanism. Further, it is comparatively easy to integrate into High-k metal gate CMOS technology. These advantages, and others, may explain the increasing popularity of FeFET memory for embedded storage as well as for stand-alone applications to be adopted in devices such as memory cards, USB flash drives, mobile phones, digital cameras, mass storage devices, MP3 players and the like.

The areal bit-density of a memory is determined by three parameters: the memory cell size, the memory array efficiency that is the ratio between memory array area and overall chip area including the driving circuitry, and the number of bits that are stored within each of the memory cells. In contrast to single-level cell (SLC) memory, which can store only one bit per cell, multi-level cell (MLC) memory has the ability to store more than one bit of data per cell. In an MLC Flash cell, the data is typically stored in the form of 4 or 8 distinguishable threshold voltage levels, thus yielding two or three bits per cell.

SUMMARY

In accordance with embodiments described herein, an integrated circuit comprises a ferroelectric memory cell. The ferroelectric memory cell comprises a ferroelectric layer stack. The layer stack comprises a ferroelectric material that is at least partially in a ferroelectric state. The ferroelectric material further comprises multiple ferroelectric domains with different coercive voltages. Therefore, the voltage that has to be applied to induce polarization reversal in a first portion out of the totality of all domains is different from the voltage that has to be applied to induce polarization reversal in a second portion out of the totality of all domains. In that way, more than two polarization states can be induced in the ferroelectric layer stack.

Second option: The ferroelectric memory cell comprises a layer stack, comprising a first ferroelectric material oxide layer and at least one second ferroelectric material oxide layer. Each of the oxide layers comprises a ferroelectric material that is at least partially in a ferroelectric state. The first ferroelectric material oxide layer and second ferroelectric material oxide layer are arranged in a multi-layer structure and can be deposited directly on top of each other or can be separated by a third layer which can be a conducting or insulating material. Further, the ferroelectric material of the first ferroelectric material oxide layer comprises a coercive voltage that is different from the coercive voltage of the ferroelectric material oxide layer. In the case of multiple ferroelectric material oxide layers, each of the layers comprises a coercive voltage that is different from the coercive voltage of the other ferroelectric storage layers.

Third option: The ferroelectric memory cell comprises a layer stack, comprising a first ferroelectric material oxide layer and a second ferroelectric material oxide layer. Each of the layers comprises a ferroelectric material that is at least partially in a ferroelectric. The first ferroelectric material oxide layer and second ferroelectric material oxide layer are arranged in a multi-layer structure and are separated by a third layer that is a conducting material. Further, after structuring both ferroelectric layers, the capacitive voltage divider between the two storage layers is balanced in a way that the two ferroelectric material oxide layer undergo ferroelectric polarization switching at different voltages applied to the layer stack structure.

In accordance with other embodiments described herein, a method for programming a ferroelectric memory cell, where the ferroelectric memory comprises a ferroelectric memory cell and a voltage source, comprising a ferroelectric layer stack, to apply a voltage to the ferroelectric layer stack, comprises applying a write voltage pulse sequence to the ferroelectric layer stack via a voltage source. The write voltage pulse sequence comprises applying a pulse with an amplitude equal or greater than the coercive voltage having a value of UC that is suitable to change a polarity of at least a first portion of domains of the ferroelectric layer stack, whereas a second portion of domains can stay unaffected, and UC is the coercive voltage needed to switch polarization of the first portion of domains into the opposite direction.

Second option: A method for programming a ferroelectric memory cell, where the ferroelectric memory comprises a ferroelectric memory cell and a voltage source, comprising a first and at least one second ferroelectric material oxide layer, to apply a voltage to the ferroelectric memory cell, comprises applying a write voltage pulse sequence to the ferroelectric layer stack via the voltage source. The write voltage pulse sequence comprises applying a pulse with an amplitude equal to or greater than the coercive voltage having a value of UC that is suitable to change a polarity of the first ferroelectric material oxide layer, whereas the polarity of the second ferroelectric material oxide layer stays unaffected, and UC is the coercive voltage needed to switch polarization of the ferroelectric material oxide layer into the opposite direction. Further, the write voltage pulse sequence comprises applying a pulse with an amplitude equal to or greater than the coercive voltage having a value of $U_{Cmax}$ that is suitable to change the polarity of all domains of the ferroelectric layer stack.

The above and still further features and advantages of embodiments of the present invention will become apparent upon consideration of the following detailed description thereof, particularly when taken in conjunction with the accompanying drawings wherein like reference numerals in the various figures are utilized to designate like components.

BRIEF DESCRIPTION OF THE DRAWINGS

FIG. 1a depicts a cross-sectional view of an example embodiment of a metal ferroelectric semiconductor (MFS) structure, where the ferroelectric layer comprises multiple domains.

FIG. 1d depicts a cross-sectional view of an example embodiment of a metal ferroelectric metal (MFM) structure, representing a storage capacitor of a FRAM memory cell, where the terminals are connected to the BL and an access transistor, respectively. The access transistor is connected to a WL and a SL within a memory array.

FIG. 2a depicts a cross-sectional view of an example embodiment of a metal ferroelectric semiconductor (MFS) structure, with two ferroelectric layers stacked one above the other.

FIG. 2b depicts a cross-sectional view of an example embodiment of a metal ferroelectric metal (MFM) structure, with two ferroelectric layers stacked one above the other.

FIG. 3c depicts a cross-sectional view of a MFMFM structure, where the ferroelectric layers together with a conductive interlayer form a capacitive voltage divider.

FIG. 4 depicts a cross-sectional view of a cell structure, comprising two MFS structures having different gate lengths. The two gates are connected to the same electrode.

FIG. 6a depicts the operating conditions to write and read a multi-domain ferroelectric memory cell.

DETAILED DESCRIPTION

In accordance with embodiments described herein, a ferroelectric memory cell of an integrated circuit comprises a structure including a ferroelectric material comprising a plurality of ferroelectric domains. The individual ferroelectric domains comprise different coercive voltages such that by applying a voltage larger than the minimum coercive voltage but smaller than the maximum coercive voltage of all domains to the material, a first portion of domains out of the plurality of all domains can be switched.

Figure 1B:
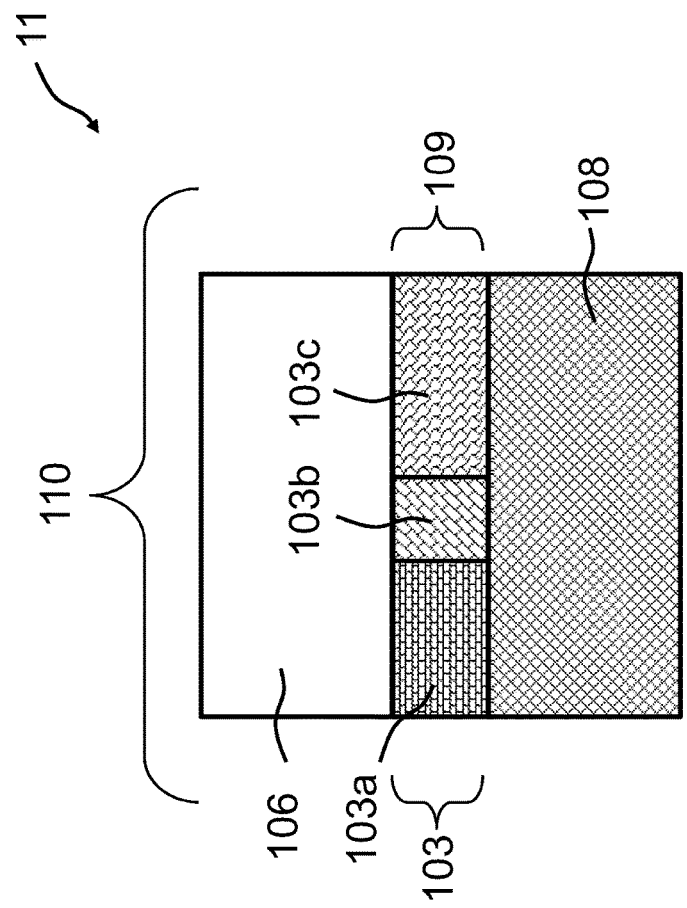
FIG. 1b depicts a cross-sectional view of an example embodiment of a metal ferroelectric metal (MFM) structure, where the ferroelectric layer comprises multiple domains.

The ferroelectric memory cell structure can be formed, e.g., as a metal ferroelectric semiconductor (MFS) structure (e.g., for FeFET structures) as depicted in FIG. 1a. The ferroelectric memory cell can also be formed as a metal ferroelectric metal (MFM) structure (e.g., for FeRAM structures) as depicted in the cross-sectional view of FIG. 1b.

Referring to the cross-sectional view of FIG. 1a, an example embodiment of a MFS structure 100 includes a support structure 101 comprising a carrier material, such as a silicon compound. An interfacial layer 105 can be formed over layer 101, which can comprise any suitable material(s) including, without limitation, $SiO_2$ or SiON or any other silicon containing material. A ferroelectric material oxide layer 103 is formed over layer 105 or directly over layer 101. The ferroelectric material oxide layer comprises different ferroelectric domains 103a, 103b and 103c, which can coincide with different grains in a polycrystalline film. Each of the domains can comprise a different coercive voltage, originating from a different crystal orientation of the individual grain, a different internal stress, a different surface energy due to different grain sizes or different doping concentration, or other differences in the physical or chemical composition. The term "ferroelectric material," as used herein, refers to a material that is at least partially in a ferroelectric state. For example, the ferroelectric material may comprise any of $HfO_2$, $ZrO_2$, any ratio of Hf and Zr combined with oxygen (e.g., $Zr_xHf_{1-x}O_2$, where x<1) as well as any combinations thereof.

The ferroelectric material oxide layer 103—and if existing—together with the interfacial layer 105 forms a layer stack 109. In one embodiment described herein the layer stack 109 represents a storage layer of a memory device.

The conductive layer 106 can comprise any one or more suitable conductive metals including, without limitation, Ti, TiN, TiSi, TiAlN, TaN, TaCN, TaSi, W, WSi, WN, Ru, RuO, Re, Pt, Ir, IrO, Ti, Ni, NiSi, Nb, Ga, GaN, C, Ge, Si, SiC oder GeSi. It is to be understood, that the material of the conductive layer can be chosen such that the work-function of the respective material influences the coercive voltage of the adjacent ferroelectric material oxide layer in a manner that is beneficial for the operation of the ferroelectric memory cell.

Referring to the cross-sectional view of FIG. 1b, another example embodiment of a MFM structure 110 includes two conductive structures 106 and 108, where the conductive layer can be formed of conductive materials such as described herein in relation to layer 106. A ferroelectric layer stack 109 is formed to be sandwiched between the two conductive structures 106 and 108. The layer stack 109 comprises a ferroelectric material oxide layer 103 which is formed in between the two conductive structures. The ferroelectric material comprises different ferroelectric domains 103a-c, which can coincide with different grains in a polycrystalline film. Each of the domains can comprise a different coercive voltage, originating for example, but not limited to, from a different crystal orientation of the individual grain, a different internal stress, a different surface energy due to different grain sizes or different doping concentration.

An example process for forming the MFS structure of FIG. 1a is described as follows. A carrier structure 101 is provided that may comprise a Si (silicon) compound, such as SiGe (silicon-germanium) or silicon-on-insulator (SOI). It is noted that other semiconductor materials can also be provided as the carrier structure 101 including, e.g., III-V semiconductor compounds such as GaAs or any other suitable substrate material. The carrier structure 101 may have already been processed so as to include components and/or other devices already be formed within the carrier structure.

An interfacial layer 105 can be formed on the support structure 101 to improve the transistor channel to gate oxide interface quality, to reduce the number of charge traps or to prevent chemical reactions between the support structure 101 and the ferroelectric material oxide layer 103.

Referring to the cross-sectional view of FIG. 1b, in another example embodiment a conductive layer 108 can be formed on a supporting structure. The conductive layer 108 can comprise any one or more suitable conductive metals including, without limitation, Ti, TiN, TiSi, TiAlN, TaN, TaCN, TaSi, W, WSi, WN, Ru, RuO, Re, Pt, Ir, IrO, Ti, Ni, NiSi, Nb, Ga, GaN, C, Ge, Si, SiC oder GeSi. The conductive layer 108 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer. The thickness of conductive layer 108 can be in the range of 0.5 nm to 10 nm or 1 nm to 300 nm.

The ferroelectric material oxide layer 103 is formed on the interfacial layer 105 or directly on the support structure 101 for the MFS structure 100 of FIG. 1a or is formed on the conductive layer 108 for the MFM structure 110 of FIG. 1b. The ferroelectric layer 103 and the interfacial layer, if available, form the layer stack 109. In each embodiment, layer 103 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer including the ferroelectric material as described herein (i.e., oxygen and at least one of Hf and Zr), where growth of the layer should be poly-crystalline. Any suitable number and types of precursors may be utilized to introduce elements such as Hf and Zr into the layer 103 utilizing any of the deposition techniques as described herein. The layer 103 is formed to have a suitable thickness, e.g., in the range from about 2 nm to 500 nm. In an example embodiment, the thickness range from layer 103 can be within the range from about 2 nm to about 15 nm.

In addition, the ferroelectric material oxide layer 103 can be formed to include, in addition to the ferroelectric material, dopants or further additives that may support the crystallization of the layer 103 into a state having ferroelectric properties. The additives can be included with the precursor materials, e.g., so as to be included during formation of the layer 103. Alternatively, the additives can be introduced into the formed layer 103 by ion implantation or any other suitable process. A concentration of the further additives within the layer may be set within a range from about 0.05 at % (atomic percent, as measured by ratio of additive atoms to ferroelectric material atoms) to about 30 at %, within a range from about 0.05 at % to about 10 at %, within a range from about 0.05 at % to about 5 at %, within a range from about 0.5 at % to about 3.5 at %, or a range from about 1 at % to about 3.5 at %. In general, the amount of the further additives may depend on the thickness of the layer 103. When increasing the thickness of the layer 103, the concentration of the further additives may also have to be increased to achieve a desired crystallization having ferroelectric properties.

Any suitable additives may be provided within the ferroelectric material oxide layer 103 including, without limitation, any one or more of C, Si, Al, Ge, Sn, Sr, Mg, Ca, Sr, Ba, Ti, Zr, Hf, Gd, Sc, La (e.g., providing Zr as an additive in a HfO2 layer), Ti, and any one or more of the rare earth elements (e.g., Y, Gd, etc.). In particular, it has been determined that certain additives having an atomic radius that is about the same as or greater than Hf are particularly suitable as dopants for optimizing ferroelectric (FE) properties of the ferroelectric material oxide layer 103 when utilizing Hf in the layer. In contrast, certain additives having an atomic radius smaller than Hf can cause anti-ferroelectric (anti-FE) properties at phase boundaries between the monoclinic and tetragonal/cubic phases of $HfO_2$. It has further been determined that additives having an atomic radius about the same as or greater than Hf can be doped at larger ranges of concentrations within the ferroelectric material oxide layer in relation to other additives while still supporting FE properties of the ferroelectric material oxide layer. Other additives having the same valence as Hf can also be beneficial as dopants to reduce charge trapping characteristics of the ferroelectric material oxide layer by reducing open bonds within the $HfO_2$ host lattice of the layer.

The conductive layer 106 for the embodiments of FIG. 1a and FIG. 1b can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer. The conductive layer can be formed from any of the types of conductive materials as previously described for conductive layer 108, and the thickness of conductive layer 106 can be in the range of 1 nm to 10 nm or 1 nm to 300 nm.

The conductive layer 106 for the embodiments of FIGS. 1a and 1b provides a covering layer for the ferroelectric material oxide layer 103 and can also serve as an electrode for the implementation of the MFS (e.g., gate electrode) or MFM within a semiconductor memory cell structure.

In an alternative embodiment, a further covering layer can also be provided between the ferroelectric material oxide layer 103 and conductive layer 106. The further covering layer can be deposited prior to forming the conductive layer 106 utilizing any suitable deposition process such as any of the previously described processes, and the further covering layer can comprise any suitable materials such as $SiO_2$, $Al_2O_3$, $Sc_2O_3$, $Y_2O_3$, BaO, MgO, SrO, $Ta_xO_y$, $Nb_xO_y$, TiO, and lanthanum dioxides. The further covering layer may also be formed in a same deposition process with the second ferroelectric material oxide layer 103 by changing the supply of source/precursor materials during the deposition process (thus allowing the deposition to be performed within the same deposition chamber). For example, when forming the ferroelectric material oxide layer 103 from $HfO_2$, a precursor gas including oxygen may be continuously provided during deposition of the amorphous layer and the further covering layer. Hafnium precursor gas may be included with the oxygen precursor gas first in the deposition chamber to form the layer 103, where the hafnium precursor gas flow is then switched to a precursor gas flow (e.g., Si) to with the continuing flow of oxygen to form the further covering layer (e.g., SiO$_2$).

After the layers have been formed, an anneal process is carried out at one or more suitable temperatures and for one or more suitable time periods to achieve a suitable amount of crystallization for the ferroelectric material within the ferroelectric material oxide layer 103. In particular, the anneal process is carried out to heat the ferroelectric material oxide layer 103 to a temperature that is above the crystallization temperature of the ferroelectric material so as to at least partially alter its crystal state from amorphous to crystalline, thus resulting in a crystallized oxide within the ferroelectric material oxide layer 103. A crystallization temperature may be chosen in a range of, e.g., from about 400° C. to about 1,200° C. depending on the thermal budget of the used devices. A preferred crystalline temperature for the annealing process is at a temperature that is above the onset of crystallization for the ferroelectric material (when the ferroelectric material is amorphous, i.e., after the layer 103 is deposited and before annealing occurs) and is further greater than about 500° C., or at a temperature that is above the onset of crystallization for the ferroelectric material and is further greater than about 300° C. The time period for annealing can be from about 0.01 second to about 12 hours. These annealing temperature ranges induce partial crystallization of the ferroelectric material oxide layer 103 (e.g., crystallization to a suitable level within the layer 103 that is less than complete crystallization of the ferroelectric material).

The partial crystallization of the ferroelectric material oxide layer 103 results in ferroelectric domains within the layer 103 that are in a ferroelectric state (e.g., at least partially). The crystallized layer 103 may exhibit different dipole moments. The orientation of the dipole moments in the crystallized layers 103 can result in a variation of the coercive voltage of the individual domains. By applying suitable voltages to the layer stack 109 the dipole orientation can be switched for a portion of ferroelectric domains with a coercive voltage that is lower than the applied voltage, while other domains stay unaffected and no change of the dipole orientation is induced for domains with a coercive voltage that is greater than the applied voltage. In other words, the ferroelectric polarization of the ferroelectric film 103 can be partially switched. In this way, more than two polarization states can be stored in the layer stack 109, representing multiple binary logic states. Thus, within one memory cell structure more than one bit can be stored, i.e., two bits with four polarization states or three bits with eight polarization states. For example the MFS structure 100 can be used to form a FeFET, where the channel conductivity in the FeFET depends upon the dipole orientation of the ferroelectric material oxide layer 103 of the layer stack 109 of the MFS structure 100. In another embodiment, the MFM structure 110 can be utilized to form a capacitor dielectric of a 1T-1C FeRAM. Here, the dipole orientation of the ferroelectric material oxide layer 103 in the layer stack 109 determines the transient current and voltage level on the bit line during read operation (the bit line is connected to the capacitor structure).

The various layers 103, 105, 106, 108 of the structures 100 and 110 depicted in FIGS. 1a and 1b can be patterned at any time after formation of the layers, either before or after the annealing process to crystallize the ferroelectric material oxide layer 103. The patterning of these layers may be carried out by an etch process using an etch mask (e.g., a hard mask), where the patterning of the layers can be carried out based upon the intended use of these layers. For example, the layers may be patterned to define at least part of a gate stack of a 1T FeFET or these layers may be patterned to define a capacitor dielectric of 1T-1C FeRAM. Any suitable spacer structures may also be formed (e.g., utilizing any suitable deposition technique, such as any of the deposition techniques previously described herein) after patterning the layers. Any other further processing of the carrier or support structure to integrate other components in relation to the support structure can be implemented before, after or together with the formation of the MFS structure 100 or MFM structure 110. For example, source/drain regions 102 of the ferroelectric memory cells may be formed before, after or together with the ferroelectric layer.

It is to be understood that the layer stack 109 can comprise a single ferroelectric material oxide layer, or in another embodiment can comprise a multitude of ferroelectric material oxide layers, or in another embodiment can comprise additional conductive or isolating interfacial layers, separating the individual ferroelectric material oxide layers.

With reference to FIGS. 2a and 2b, in one example the layer stack 109 comprises a multi-layer stack of at least two ferroelectric material oxide layers 203 and 204. The combination of the first and second ferroelectric material oxide layers 203 and 204 defines a combined ferroelectric layer stack 109. The different ferroelectric material oxide layers can be separated by an interfacial layer 207, which can comprise an insulating or a conducting material. It is to be understood that the ferroelectric layer stack 109 can comprise a multitude of ferroelectric material oxide layers.

The ferroelectric layers 203 and 204 comprise different coercive voltages, originating for example, but not limited to, from a different crystal orientation of the grains inside the ferroelectric material oxide layers, a different internal stress, a different surface energy due to different grain sizes and different film thickness or different doping species and doping concentration. The ferroelectric domains 203a and 204a within each of the layers 203 and 204, respectively, can extend over the complete layer, or several similar domains can be formed within each of the layers besides each other. By applying a voltage larger than the minimum coercive voltage but smaller than the maximum coercive voltage of the multitude of ferroelectric material oxide layers in the combined ferroelectric layer stack 109, a first portion of ferroelectric domains out of the plurality of all ferroelectric domains can be switched. In that way different polarization states can be written into the combined layer stack 109, which represent multiple logic bits.

For example, in one embodiment, the layer stack 109 comprises two ferroelectric material oxide layers 203 and 204 with different coercive voltages. Therefore by combination of the two possible polarization states of the two ferroelectric material oxide layers 203 and 204 four combined polarization states of the layer stack 109 can be attained. In reference to FIG. 2a in one embodiment layer stack 109 represents the gate oxide of a FeFET, where the four different polarization states of the layer stack 109 result in four different threshold voltages of the memory cell transistor 200, which can be sensed by a suitable sensing circuit connected to the source, drain and gate electrodes. In reference to FIG. 2b in another embodiment layer stack 109 represents the dielectric of a storage capacitor, where the four different polarization states of the layer stack 109 result in four different polarization currents, which result from applying a read pulse to memory cell capacitor 210, which can be sensed by a suitable sensing circuit connected to the capacitor electrodes.

The ferroelectric material oxide layers 203 and 204 can be formed as was previously described in relation to the ferroelectric material oxide layer 103. The ferroelectric material oxide layers 203 and 204 can be formed to have a thickness within the same ranges as previously noted for the first ferroelectric material oxide layer 103. For example, each of the first and second ferroelectric material oxide layers 203 and 204 can have the same or substantially similar thicknesses. Alternatively the first and second ferroelectric material oxide layers 203 and 204 can have different thicknesses. The thickness of the combined ferroelectric material oxide layer 109 can be within the range from about 500 nm to about 2 nm, or from about 50 nm to about 1 nm. In addition, the ferroelectric material oxide layers 203 and 204 can be formed to include, in addition to the ferroelectric material, dopants or further additives that may support the crystallization of the layers 203 and 204 into a state having ferroelectric properties. The dopant species and dopant concentration as well as the method of introducing the dopant into the ferroelectric material oxide layers can be different for the two layers 203 and 204.

An interfacial layer 207 can be formed as conductive or isolating layer as was previously described in relation to the conductive layer 106. It is to be understood, that the material of the interfacial layer can be chosen such that the work-function of the respective material influences the coercive voltage of the adjacent ferroelectric material oxide layers in a manner that induces a difference in the coercive voltage of the adjacent ferroelectric material oxide layers 203 and 204.

After the formation of the ferroelectric layers 203 and 204, an annealing step is carried out at one or more suitable temperatures and for one or more suitable time periods to achieve a suitable amount of crystallization for the ferroelectric material within the ferroelectric material oxide layers 203 and 204. The annealing step can be split up into an annealing step which is performed first after forming ferroelectric material oxide layers 203 and a second step which is performed first after forming ferroelectric material oxide layers 203.

Figure 3A:
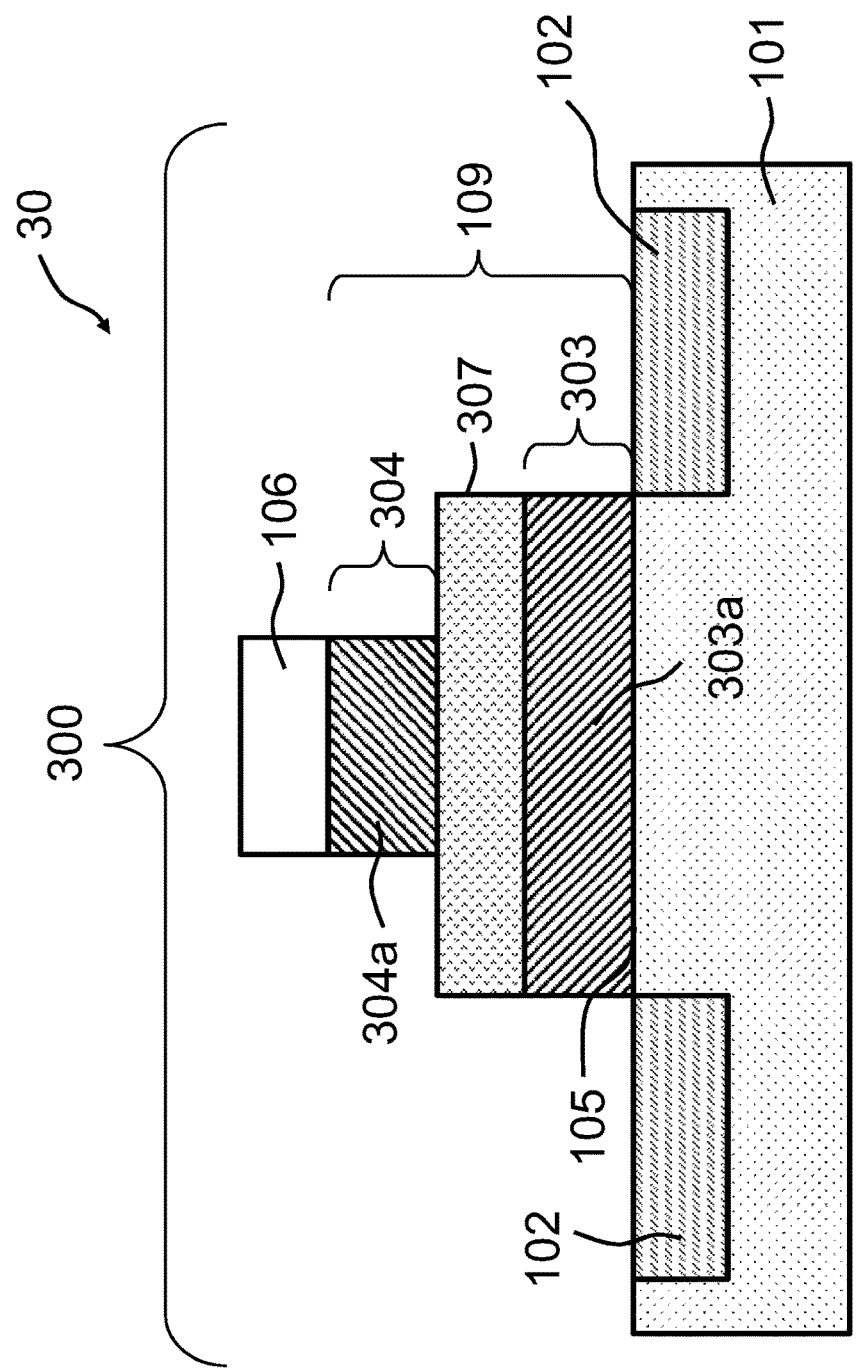
FIG. 3a depicts a cross-sectional view of a cell structure, with two ferroelectric layers of different area, embedded within the gate stack and separated by a floating conductive layer.
Figure 3B:
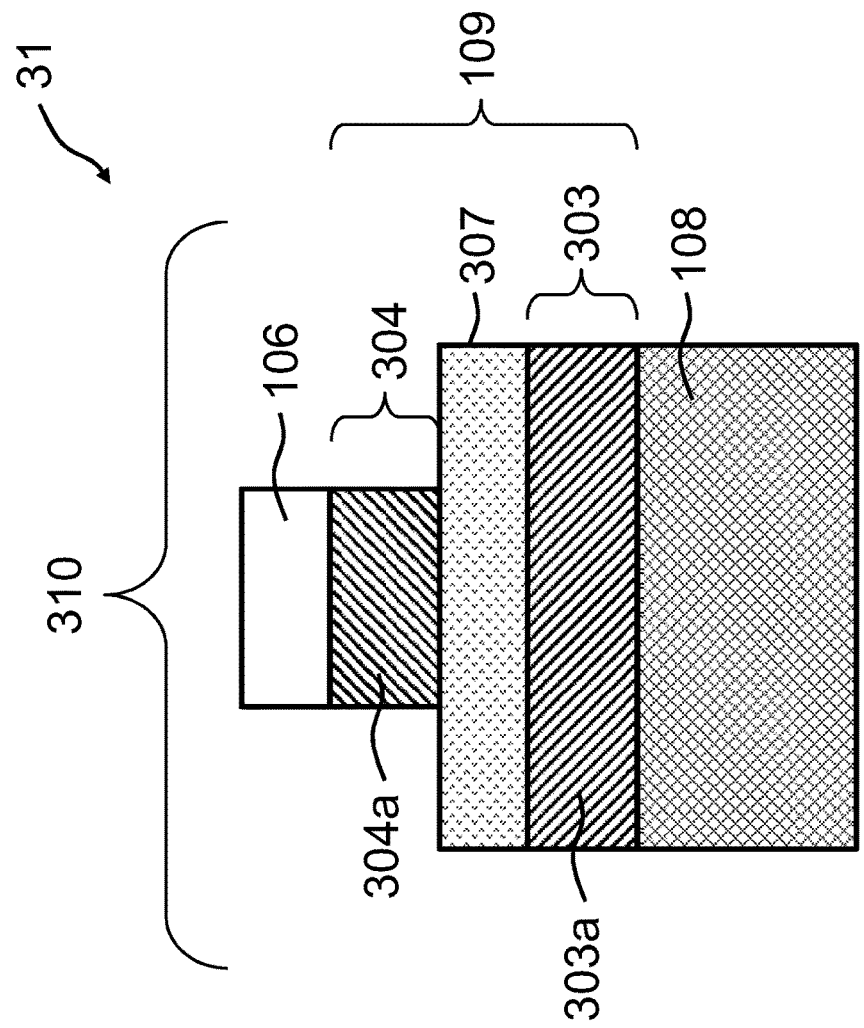
FIG. 3b depicts a cross-sectional view of a MFMFM structure, where two ferroelectric layers of different lengths are separated by a floating conductive layer.

With reference to FIGS. 3a and 3b in another embodiment the ferroelectric layer stack 109 is replaced by a multi-layer stack of at least two ferroelectric material oxide layers 303 and 304. The ferroelectric material oxide layers are separated by a conductive electrode layer 307. The combination of the first and second ferroelectric material oxide layers 303 and 304 together with the conductive interlayer 307 defines a combined layer stack 109. It is to be understood that the ferroelectric layer stack 109 can include a multitude of ferroelectric material oxide layers separated by conductive layers.

The ferroelectric layers 303 and 304 comprise the same coercive voltages or coercive voltages that differ by not more than 10% or not more than 30% or not more than 70% or not more than 200% from each other.

The ferroelectric material oxide layers 303 and 304 can be formed as was previously described in relation to the ferroelectric material oxide layer 103. The ferroelectric material oxide layers 303 and 304 can be formed to have a thickness within the same ranges as previously noted for the first ferroelectric material oxide layer 103. For example, each of the first and second ferroelectric material oxide layers 303 and 304 can have the same or substantially similar thicknesses. Alternatively the first and second ferroelectric material oxide layers 303 and 304 can have different thicknesses. The thickness of the combined ferroelectric layer stack 109 can be within the range from about 500 nm to about 2 nm, or from about 50 nm to about 2 nm. In addition, the ferroelectric material oxide layers 303 and 304 can be formed to include, in addition to the ferroelectric material, dopants or further additives that may support the crystallization of the layers 303 and 304 into a state having ferroelectric properties. The dopant species and dopant concentration as well as the method of introducing the dopant into the ferroelectric material oxide layers can be equal or different for the two layers 303 and 304.

The conductive material layer 307 can be formed as was previously described in relation to the conductive layer 106. It is to be understood, that the material of the conductive layer can be chosen such that the work-function of the respective material influences the coercive voltage of the adjacent ferroelectric material oxide layers in a manner that induces a difference in the coercive voltage of the adjacent ferroelectric material oxide layers 303 and 304.

After the formation of the ferroelectric layers 303 and 304, an annealing step is carried out at one or more suitable temperatures and for one or more suitable time periods to achieve a suitable amount of crystallization for the ferroelectric material within the ferroelectric material oxide layers 303 and 304. The annealing step can be split up into an annealing step performed first after forming ferroelectric material oxide layers 303 and a second step performed first after forming ferroelectric material oxide layers 304. The ferroelectric domains 303a and 304a within each of the layers 303 and 304, respectively, can extend over the complete layer, or several similar domains can be formed within each of the layers besides each other.

The ferroelectric material oxide layers 303 and 304 and the conductive layer 307 can be patterned at any time after formation of the layers, either before or after the annealing process to crystallize the ferroelectric material oxide layers 303 and 304. The patterning of these layers can be carried out by an etch process using an etch mask (e.g., a hard mask), where the patterning of the layers can be carried out based upon the intended use of these layers. For example, the layers may be patterned to define at least part of a gate stack of a 1T FeFET or these layers may be patterned to define a capacitor dielectric of 1T-1C FeRAM. Any suitable spacer structures may also be formed (e.g., utilizing any suitable deposition technique, such as any of the deposition techniques previously described herein) during or after patterning of the layers.

Any other further processing of the carrier or support structure to integrate other components in relation to the support structure can be implemented before, after or together with the formation of the MFS structure 300 or MFM structure 310. For example, source/drain regions 102 of the ferroelectric memory cells may be formed before, after or together with the ferroelectric layer.

In one example of one embodiment, with reference to FIG. 3c, the ferroelectric material oxide layers 303 and 304 together with the conductive interlayer 307 form a capacitive voltage divider, which comprises two capacitors C1 and C2. C1 is formed by the electrodes 106 and 307 and ferroelectric material oxide layer 304, whereas C2 is formed by the electrodes 108 and 307 and ferroelectric material oxide layer 303. The ferroelectric material oxide layers 303 and 304 can be patterned such that the capacitances of two in series connected capacitors C1 and C2 differ due to a different area of the capacitors, respectively. By applying a voltage V to the combined layer stack 109, that is, applying a voltage between the upper electrode 106 and lower electrode 308, due to the capacitive voltage divider a larger voltage drop is reached over the smaller capacitor. For example, for the case of C1<C2, the voltage at C1, which is VC1=V (C1+C2)/C1, is larger than the voltage drop at C2, which is VC2=V (C1+C2)/C2. Therefore in case of equal coercive voltages of ferroelectric material oxide layers 303 and 304 the polarization reversal will occur first in capacitor C1 that is in the ferroelectric material oxide layer 304. Upon further increase of the applied voltage V, also the coercive voltage of C2 will reached, which yields polarization reversal in C2, that is, in the ferroelectric material oxide layer 303. In this manner, by combination of the two possible polarization states of the two ferroelectric material oxide layers 303 and 304, four combined polarization states of the layer stack 109 can be attained. In reference to FIG. 3a, in one embodiment layer stack 109 represents the gate oxide of a FeFET, where the four different polarization states of the layer stack 109 result in four different threshold voltages of the memory cell transistor 300, which can be sensed by a suitable sensing circuit connected to the source, drain and gate electrodes, as is depicted exemplarily in FIG. 1c. In reference to FIG. 3b, in another embodiment layer stack 109 represents the dielectric of a storage capacitor, where the four different polarization states of the layer stack 109 result in four different polarization currents, which result from applying a read pulse to memory cell capacitor 310, which can be sensed by a suitable sensing circuit connected to the capacitor electrodes, as is depicted exemplarily in FIG. 1d.

In one further embodiment with reference to FIG. 4, a ferroelectric memory device 40 comprises a ferroelectric memory cell structure 400, comprising a ferroelectric layer stack 109, comprising a ferroelectric material oxide layer 103, which represents the gate oxide of a FeFET memory cell 400. The memory cell comprises two electrically coupled gate conductors 106a and 106b, which are patterned such that the area of gate conductor 106a is larger than the area of gate conductor 106b. The ferroelectric material oxide layer 103 can be patterned self-aligned to the gate conductors 106a and 106b such that the area of the ferroelectric domain structure 103d is larger than ferroelectric domain structure 103e. Due to the different surface energy and internal stress of the differently sized grains, the coercive voltage of the coinciding ferroelectric domains is different. In this manner, by applying a voltage V to both coupled gate electrodes within memory cell 400, the two patterned domains can be switched individually. As a result, by combination of the two possible polarization states of the two ferroelectric domain structures 103d and 103e four combined polarization states of the layer 103 can be attained.

The source and drain regions 102 and 102a can be formed as described previously. In one embodiment, the source/drain region 102a connects the two transistor channels that are formed by the patterning of the gate conductors 106a and 106b. In this manner, the memory cell area can be reduced and no wiring via metallic contact structures and additional metallization layers between the two transistor structures is required.

It is to be understood that the patterning of the ferroelectric material oxide layers can be performed in a different way than by etch. In another embodiment, the ferroelectric material oxide layer is deposited into a pre-structured trench, thus confining the formation of the domains. In another example, the ferroelectric material oxide layer is deposited self-aligned by self-aligned selective growth on top of a pre-structured supporting structure 101, thus confining the formation of the domains. In this way, the targeted formation of ferroelectric domains with targeted size can be realized in order to adjust the switching properties of the single domains.

It is to be understood that the schematic cross-sectional view of the FeFET memory cell 100, 200 or 300 or MFM capacitor 110, 210 or 310 forms a part of an integrated circuit 10, 11, 21, 30, 31, respectively. For example, an integrated circuit 10 may comprise a plurality of FeFET memory cells 100 arranged in the form of a ferroelectric memory cell array. In another example, an integrated circuit 11 may comprise a plurality of ferroelectric capacitor memory cells 110, arranged in the form of a ferroelectric memory cell array. Additional circuits may also be formed in the support structure 101. By way of example, these additional circuits may include word line drive circuits, bit line drive circuits, source line drive circuits, sense circuits, control circuits, and any other suitable circuits for the integrated circuit. In general, any semiconductor devices, e.g., diodes, bipolar transistors, diffusion resistors, silicon controlled rectifiers (SCR), and field effect transistors (FET), may be formed within the support structure 101. In addition, a wiring area including a stack of conductive layers, e.g. metal layers, and intermediate dielectrics may be formed over portions of the support structure 101, where the wiring area may be used to interconnect semiconductor devices or circuit parts of the integrated circuit.

It is further noted that the MFS structure 100, 200 or 300 can also be formed with any one or more suitable geometries including, without limitation, planar or 3D geometry such as Trench MOSFET, FinFET, RCAT ("Recessed Channel Array Transistor"), TSNWFET ("Twin Silicon NanoWire Field Effect Transistor"), PiFET ("Partially insulated Field Effect Transistor"), McFET ("Multi-channel Field Effect Transistor").

Figure 5:
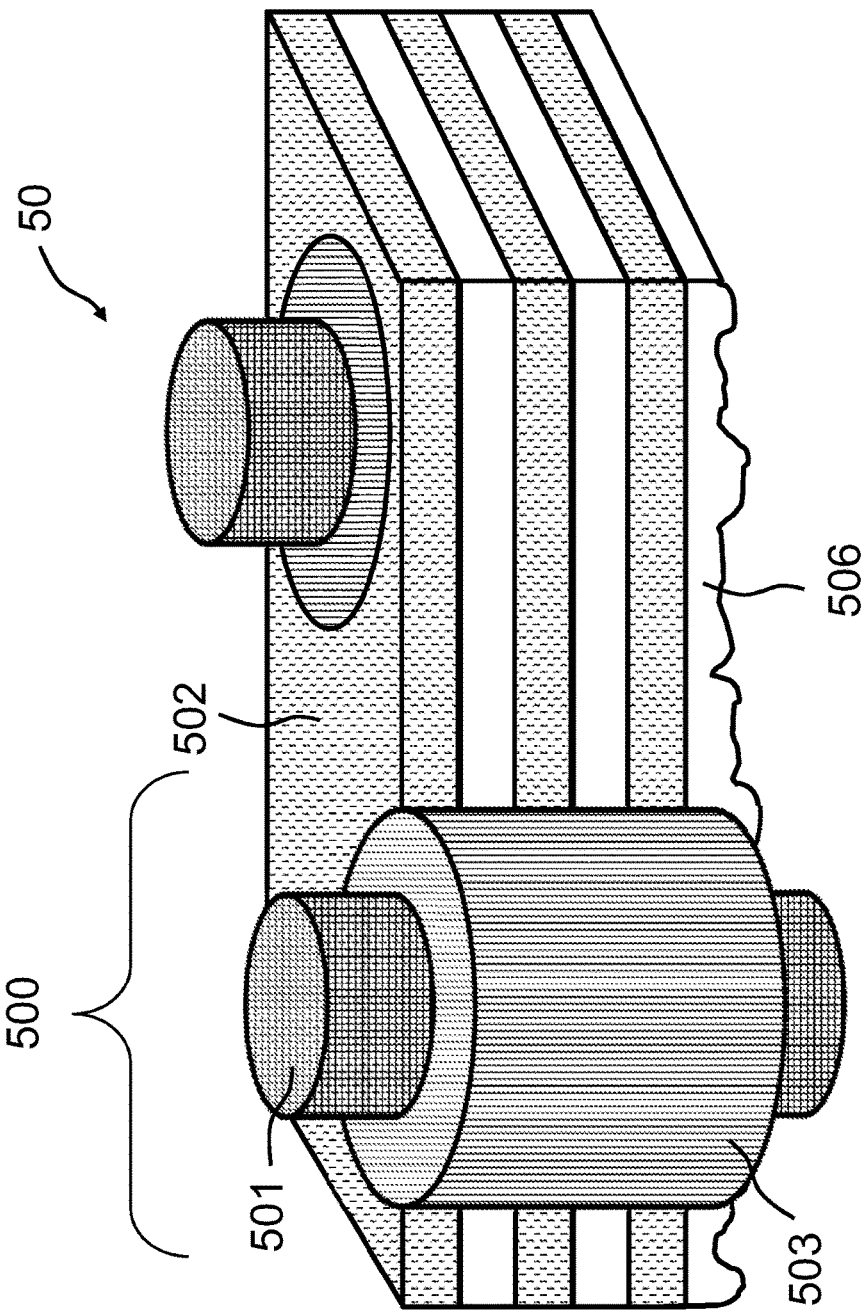
FIG. 5 depicts a cross-sectional view of a 3D-cell structure, comprising a multitude of gate layers which are isolated by isolation layers, comprising transistor channel pillars comprising a semiconducting material, and comprising a ferroelectric layer stack surrounding the transistor channel pillars.

With reference to FIG. 5, it is noted that the memory cell structures 100, 200 or 300 can also be formed with any one or more suitable geometries including, without limitation, 3D geometries such as memory cell structures 500 comprising pillar transistor channels 501, comprising a surrounding ferroelectric layer or a combined stack of ferroelectric layers 503, comprising properties as described earlier for ferroelectric material oxide layers 103, 203, 204, 303, 304, interface layers 105, 207 and electrode layers 307. Further, memory cell structure 500 may comprise a multitude of gate electrode layers 506 which are isolated by isolation layers 502. Memory cell structure 500 can form a vertical NAND-string of FeFET cell transistors.

It is further noted that the MFM structure 110, 210 or 310 can also be formed with any one or more suitable geometries including, without limitation, planar or 3D geometry such as Trench capacitors, stacked capacitors or cup-capacitors.

While the example embodiments described herein are in relation to 1T ferroelectric memory cells (FeFETs) and 1T-1C ferroelectric memory cells, the present invention is not limited to such memory cells but instead can be applied to any suitable type of ferroelectric memory cell (e.g., 2T-2C memory cells).

Since the presence of the ferroelectric properties is necessarily accompanied by the presence of piezoelectric properties a ferroelectric memory cell or a piezo element can be formed by using a MFM capacitor. Applying a certain voltage to the device will cause a piezoelectric expansion of the device with can be used for different applications where piezo-elements are included into a device to cause a transformation of an input signal (mainly an electrical signal) into motion or to prevent a motion. The main advantage of a $HfO_2$ based piezo element is that the material is lead free.

The embodiments described herein enhance the performance of a ferroelectric memory cell and increases the memory bit density associated with the memory cell. In particular, multiple polarization states of the layer stack 109 enable the storage of multiple bits within one memory cell. Thus the overall manufacturing costs per bit can be reduces.

Figure 1C:
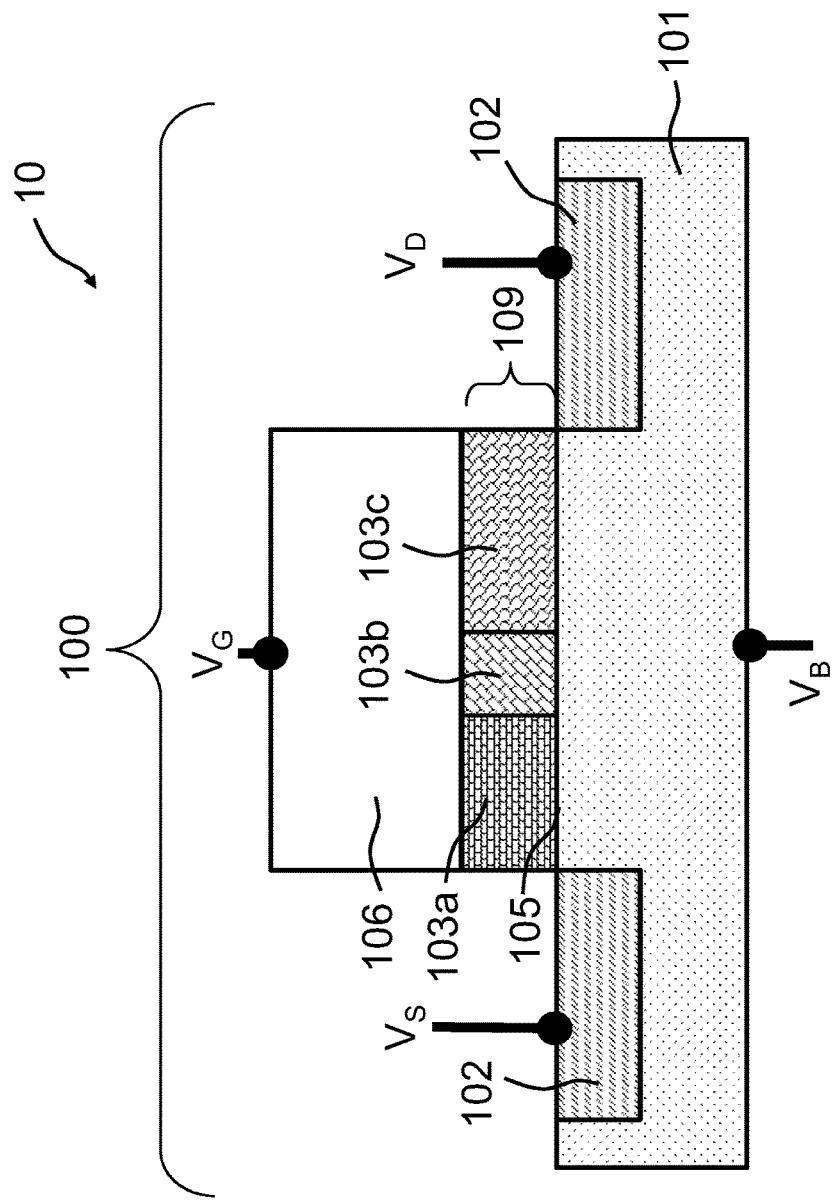
FIG. 1c depicts a cross-sectional view of an example embodiment of a metal ferroelectric semiconductor (MFS) structure, representing a FeFET structure where the gate, source, drain and bulk terminals are connected to voltage sources, applying the voltages VG, VS, VD and VB, respectively.

As one example of other embodiments described herein, a method for programming a ferroelectric memory cell comprises a general voltage scheme for read and write operations and for the idle state for the ferroelectric memory structure, depicted in FIG. 1a, FIG. 2a, FIG. 3a and FIG. 4, comprising voltage combinations as indicated in FIG. 6a. $V_G$, $V_D$, $V_S$ and $V_B$ represent voltage levels applied to the gate, drain, source and bulk terminals, respectively, as indicated in FIG. 1c, respectively. In the idle state, all terminals are grounded. Read operation comprises applying a read gate $V_{G,r}$ and drain $V_{D,r}$ voltages with bulk and source terminals grounded and sensing the resulting drain current. This current could assume a multitude of discrete levels at a fixed sensing $V_{G,r}$ and $V_{D,r}$ voltages and would correspond to a multitude of distinct stored polarization states within the storage layer.

Referring to FIG. 1a and FIG. 4, a write operation of a ferroelectric memory cell, comprising a voltage pulse which is applied to the ferroelectric layer stack 109 of the memory cell to change the direction of the electric polarization, herein indicated as polarization, of a portion or of the totality of ferroelectric domains within the ferroelectric material. For simplicity, structure in FIG. 1a will be taken as an example. The structure depicted in FIG. 1a can represent a NMOS FeFET. By first applying a negative voltage to the gate electrode 106, such that it is higher in amplitude than the highest negative coercive voltage $|-U_{C,max}|$ in the storage layer, all ferroelectric domains will have the polarization switched in one direction, developing the highest possible threshold voltage of the NMOS transistor. Successively, applying positive voltage levels to the gate electrode 106 greater than coercive voltage values corresponding to a portion of but not to the totality of ferroelectric domains in the storage layer, only this portion of ferroelectric domains will be switched to the opposite polarization. In this way, different intermediate threshold voltage levels corresponding to the applied gate voltage amplitude, and therefore to the quantity of the switched ferroelectric domains could be created.

Referring to memory cell structures depicted in FIG. 2a and FIG. 3a, a write operation comprises a voltage combinations indicated in FIG. 6a. It further comprises grounding drain, source and bulk terminals and applying suitable combination of gate voltage levels $V_{PP}$, $V_P$, $-V_{EE}$, and $-V_E$ depending on the polarization state that is to be reached. It is to be noted that these voltages have to be tuned taking into consideration the voltage divider within the gate stack.

Figure 6B:
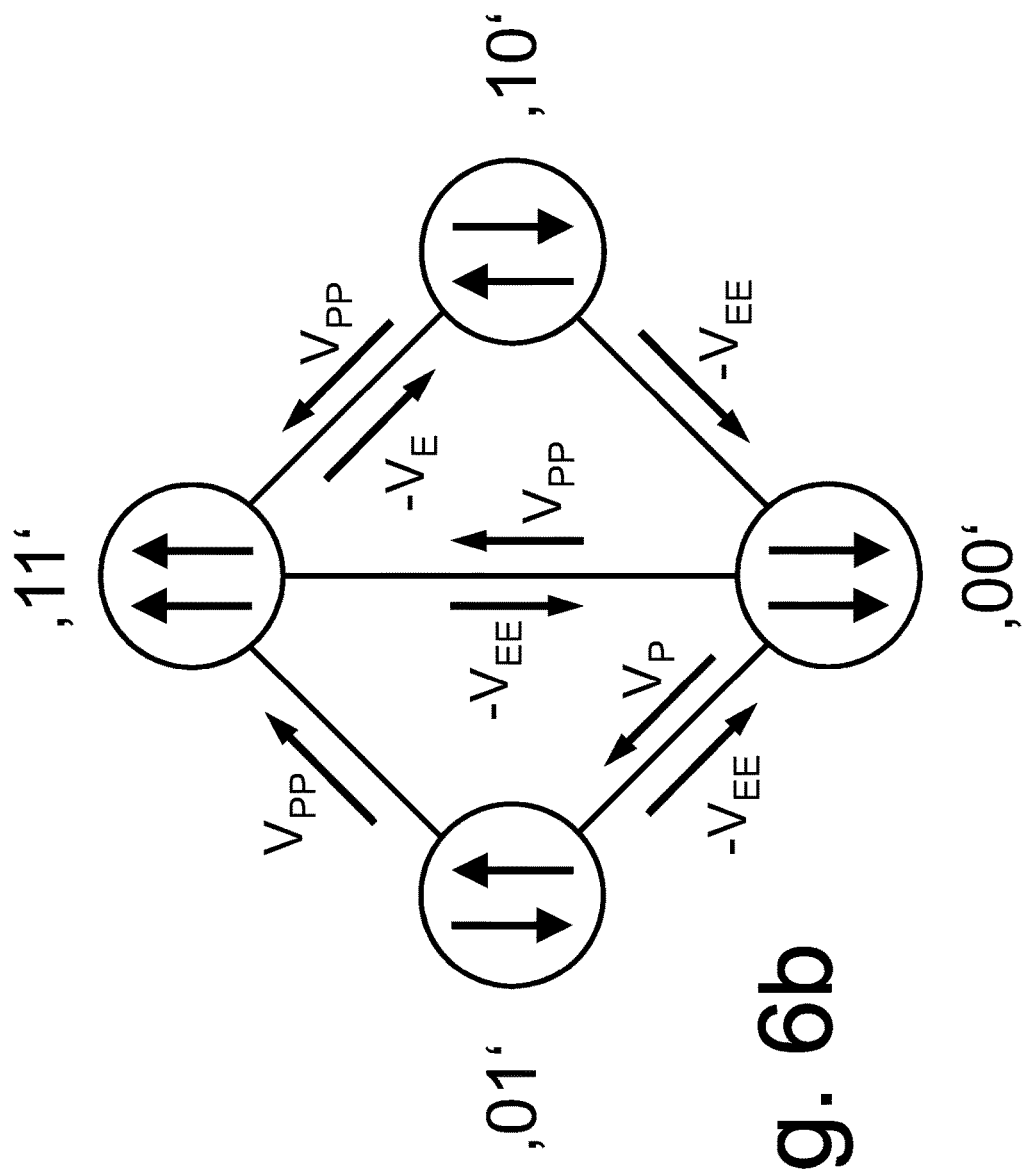
FIG. 6b depicts a state diagram to operate a two-domain ferroelectric cell structure.

Another example of a further embodiment described herein comprises a possible operating scheme, which is illustrated by the allowed transitions between different intermediate states of the cell as is represented in FIG. 6b. This scheme applies for the ferroelectric memory cells as exemplarily depicted in FIG. 2a and FIG. 3a. For simplicity, FIG. 2a will be taken as an example. The two arrows correspond to the polarization direction of the ferroelectric material oxide layers 203 and 204. State '11' and State '00' correspond to the situation where layers 203 and 204 have mutually parallel polarization directions and lead to two extreme threshold voltage levels of the FeFET. State '10' and State '01' correspond to the situation where 203 and 204 have mutually antiparallel polarization directions and represent two intermediate threshold voltage levels. State '11' can be reached by applying a positive gate voltage $V_{PP}$ producing a voltage drop in either 203 layer or 204 layer larger than the highest positive coercive voltage $+U_{C,max}$ of these two layers, independently of the previously stored state. State '11' can be reached by applying a negative gate voltage $-V_{EE}$ producing a voltage drop in either 203 layer or 204 layer larger than the highest negative coercive voltage $|-U_{C,max}|$ of these two layers, independently of the previously stored state. State '10' can be reached only starting from the already written State '11' and applying a negative pulse $-V_E$, where $V_E<V_{EE}$, in order to switch the polarization of only one layer having a lower coercive voltage. In this example embodiment state '01' can be reached only starting from the already written State '00' and applying a positive pulse $V_P$, where $V_P<V_{PP}$, in order to switch the polarization of only one layer having a lower coercive voltage. In this example the direct state transitions from '11' to '01', from '00' to '10', as well as from '10' to '01' and vice versa, are not feasible.

It is to be understood that present invention is not limited to the exemplarily described operation scheme and that the state-diagram can be different, e.g. when implementing more than two ferroelectric material oxide layers into the layer stack 109, or if the coercive voltage for program and erase operation exhibit different absolute values, which can originate from different work-functions of the electrodes 106, 101, 108 or conductive interlayers 307.

Ferroelectric capacitor structures illustrated in FIGS. 1b, 2b and 3b are intended to be integrated in 1T-1C multi-level FeRAM memory cell, as depicted in FIG. 1d. Here, a conventional NFET acting as an access transistor is adopted to perform write and read operations: in both operations the word-line (WL) is asserted, which means a high voltage VWL is applied in order to induce a conductive channel connecting the source-line (SL) and the ferroelectric capacitor. In the idle state, the WL is not asserted, leaving the access transistor in its OFF state. In a similar manner as previously described for the 1T writing patterns, taking into account the voltage divider for structures in FIG. 2b and in FIG. 3b, the 1T-1C cell can have the same voltage scheme, with the exception that the positive $V_{PP}$ and $V_P$ voltages are applied to SL while BL is grounded, whereas the positive $V_{EE}$ and $V_E$ voltages are applied to BL while SL is grounded. In this way, negative voltages can be completely avoided, as known for the standard 1-bit FeRAM architecture. A cell can be read by floating the SL and applying a positive voltage ($V_{DD}$) to the BL while asserting the WL. The distinct stored levels will induce then distinct displacement current signals to be sensed at SL. Since this operation is destructive, the data must be written back into the cell after each read (data restore).

Although specific embodiments have been illustrated and described herein, it will be appreciated by those of ordinary skilled in the art that a variety of alternate and/or equivalent implementations may be substituted for the specific embodiments shown and described without departing from the scope of the present invention. This application is intended to cover any adaptions or variations of the specific embodiments discussed herein. Therefore, it is intended that this invention be limited only by the claims and the equivalents thereof.

What is claimed is:

1. An integrated circuit element comprising:
   a first electrode;
   a second electrode; and
   a storage layer disposed between the first and the second electrodes, the storage layer comprising a material partially in a ferroelectric state and having two or more ferroelectric domains in the material, each of the ferroelectric domains within the material having a single coercive voltage, and at least some of the ferroelectric domains having different coercive voltages such that voltages necessary to reach the coercive voltages of the at least some of the ferroelectric domains are different.

2. The integrated circuit element of claim 1, wherein the material of the storage layer comprises a polycrystalline film having a same thickness and composition in each of the two or more ferroelectric domains and wherein the two or more ferroelectric domains correspond to different grains.

3. The integrated circuit element of claim 1, wherein the two or more ferroelectric domains differ in at least one of: crystal orientation; internal stress; grain size; and doping concentration.

4. The integrated circuit element of claim 1, wherein the voltages necessary to reach the coercive voltages of two of the two or more ferroelectric domains differ by at least 50 mV from each other.

5. The integrated circuit element of claim 1, wherein the two or more ferroelectric domains in the storage layer disposed between the first and the second electrode are arranged on top of each other.

6. The integrated circuit element of claim 1, wherein the storage layer further comprises at least one interlayer disposed between the first and second electrodes.

7. The integrated circuit element of claim 6, wherein the at least one interlayer is conductive.

8. The integrated circuit element of claim 1, wherein the storage layer comprises one or more of the following additives: C, Si, Al, Ge, Sn, Sr, Mg, Ca, Sr, Ba, Ti, Zr, Hf, Gd, Sc, La or their oxides.

9. The integrated circuit element of claim 8, wherein the concentration of at least one additive is within the range from about 0.05% to about 5%.

10. The integrated circuit element of claim 1, wherein the material of the storage layer comprises: hafnium oxide, zirconium oxide or a solid solution of hafnium oxide and zirconium oxide.

11. The integrated circuit element of claim 1, wherein the thickness of the material of the storage layer partially in the ferroelectric stage ranges from 2 to 15 nm.

12. The integrated circuit element of claim 1, wherein the first and second electrodes comprise one or more of the following: Ti, TiN, TiSi, TiAlN, TaN, TaCN, TaSi, W, WSi, WN, Ru, RuO, Re, Pt, Ir, IrO, Ni, NiSi, Nb, Ga, GaN, C, Ge, Si, SiC or GeSi.

13. The integrated circuit element of claim 1, wherein the first or second electrode and the storage layer form at least part of a gate structure or a FeFET.

14. The integrated circuit element of claim 1, wherein the first or second electrode and the storage layer form at least part of a capacitor.

15. The integrated circuit element of claim 1, wherein the integrated circuit element is arranged in a plurality of integrated circuit elements.

16. The integrated circuit element of claim 1, wherein the material partially in a ferroelectric state is partially crystallized.

17. The integrated circuit element of claim 1, wherein the storage layer comprises a multitude of ferroelectric material oxide layers.

* * * * *